United States Patent
Ryu et al.

(10) Patent No.: US 8,802,999 B2
(45) Date of Patent: Aug. 12, 2014

(54) EMBEDDED PRINTED CIRCUIT BOARD AND MANUFACTURING METHOD THEREOF

(75) Inventors: Jong In Ryu, Chungcheongnam-do (KR); Yul Kyo Chung, Gyeonggi-do (KR); Tae Sung Jeong, Gyeonggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 149 days.

(21) Appl. No.: 13/478,802

(22) Filed: May 23, 2012

(65) Prior Publication Data

US 2013/0098667 A1    Apr. 25, 2013

(30) Foreign Application Priority Data

Oct. 25, 2011    (KR) .................... 10-2011-0109377

(51) Int. Cl.
*H05K 1/09*    (2006.01)
(52) U.S. Cl.
USPC .......................................... 174/257; 174/260

(58) Field of Classification Search
CPC ....................................................... H05K 1/09
USPC ................................................. 174/257, 260
See application file for complete search history.

(56) References Cited

FOREIGN PATENT DOCUMENTS

| | | |
|---|---|---|
| KR | 10-2006-0095813 | 9/2006 |
| KR | 10-2009-0130727 | 12/2009 |
| KR | 10-2010-0030151 | 3/2010 |
| KR | 10-2010-0123399 | 11/2010 |
| KR | 10-2011-0047755 | 5/2011 |

OTHER PUBLICATIONS

Korean Office Action issued Jun. 14, 2013 in corresponding Korean Application No. 10-2011-0109377.

*Primary Examiner* — Timothy Thompson
*Assistant Examiner* — Charles Pizzuto

(57) ABSTRACT

An embedded printed circuit board (PCB) includes: a copper foil laminate; an internal electronic component inserted into the copper foil laminate; a first circuit pattern formed on a surface of the internal electronic component; and a second circuit pattern formed on the copper foil laminate.

10 Claims, 2 Drawing Sheets

100

110

120

121
122
123

200

160a    250    112(122)    160b
                           130
105    113(123)    110(120)

EMBEDDED PRINTED CIRCUIT BOARD AND MANUFACTURING METHOD THEREOF

CROSS REFERENCE(S) TO RELATED APPLICATIONS

This application claims the benefit under 35 U.S.C. Section 119 of Korean Patent Application Serial No. 10-2011-0109377, entitled "Embedded Printed Circuit Board and Manufacturing Method Thereof" filed on Oct. 25, 2011, which is hereby incorporated by reference in its entirety into this application.

BACKGROUND OF THE INVENTION

1. Technical Field

The present invention relates to an embedded printed circuit board (PCB) in which an electronic component is embedded and, more particularly, to an embedded printed circuit board in which surfaces of electronic components embedded therein are used as a wiring space to thus simplify a layer configuration and optimize wiring on a substrate, and a manufacturing method thereof.

2. Description of the Related Art

A printed circuit board (PCB), formed by printing line patterns with a conductive material such as copper on an electrically insulating substrate, refers to a substrate immediately before electronic components are mounted thereon. Namely, in order to closely mount a large number of various types of electronic components on a flat plate, mounting positions of the respective components are determined and circuit patterns connecting the components are fixedly printed on the surface of the flat plate.

Among methods for mounting components on the line pattern PCB, a surface mount technique (SMT) has normally been used. The SMT is a method for attaching surface mounted components (SMCs), which can be directly mounted on the surface of the PCB, to electronic circuits. The electronic devices manufactured thusly are called surface-mounted devices (SMDs).

In an electronic industry, the SMT is replacing a through hole technology attachment scheme using a component for inserting an element pin into a hole of a PCB. In general, SMCs are smaller than the same through hole components. The reason is because pins of the SMCs may be shorter or may be omitted. SMCs have shorter pins, and there are various types of packages such as a surface contact type package, a ball grid array (BGA) type package, a package including pins protruded from components thereof, and the like.

In comparison to the old through hole technology, the SMT has the following advantages. Namely, the components are smaller and more lightweight, a board can be processed with a smaller hole, components can be simply and automatically assembled, and components are automatically disposed precisely with a small amount of error (surface tension of melted solder pulls component pins to a solder pad to arrange it at an accurate position).

Also, components can be attached to both sides of the PCB, and resistance and impedance of the component pins are reduced (performance and operating frequency of the components are increased). Also, the components have excellent mechanical performance in a wobbling or vibration state, and in general, the SMCs are cheaper than through hole components, the SMT causes less unnecessary RF signal effect than that of the through hole technology, and flexibility of component characteristics is considerably enhanced.

In line with the development of the electronics industry, electronic components are increasingly required to be multi-functional and have a smaller size, and in particular, a trend in the market based on lighter, thinner, shorter, and smaller personal mobile terminals leads to a reduction in thickness of PCBs. Accordingly, a device mounting scheme, which is different from the existing device mounting scheme, has emerged. That is, an embedded PCB in which active components such as an IC or the like, or passive components such as a capacitor, for example, a multilayered ceramic component (MLCC), or the like, are mounted to enhance high density and reliability or organically coupled to pursue enhancement of a package itself.

Unlike the related art PCB in which passive elements and active elements share the surface of the PCB, the embedded PCB is configured such that passive elements such as a resistor, a capacitor, or the like, or active elements such as an IC, or the like, are embedded in the substrate, securing an extra space on the surface of the PCB, and in comparison to the related art PCB, wiring density can be enhanced to develop a more compact electronic device.

Also, since the elements are connected in a vertical direction, a wiring length is drastically reduced, which leads to a reduction in generation of impedance due to a parasitic effect and a problem such as signal delay, or the like, in an electronic device. For these reasons, an embedded active/passive device (EPAD) technology has come to prominence in order to enhance integration.

However, the embedded PCB requires a space to be secured for connecting electrodes of the electronic component embedded therein, and a portion where the component is embedded is not available for via processing, or the like. Thus, in case in which a different component is mounted on the surface of the substrate or the surface wiring is complicated, a layer must be added.

SUMMARY OF THE INVENTION

An object of the present invention is to provide an embedded printed circuit board (PCB) which does not require an additional layer even when a different component is mounted on a surface of a substrate in which an electronic component is embedded or a surface wiring is complicated, and a manufacturing method thereof.

According to an exemplary embodiment of the present invention, there is provided an embedded printed circuit board (PCB) including: a copper foil laminate; an internal electronic component inserted into the copper foil laminate; a first circuit pattern formed on a surface of the internal electronic component; and a second circuit pattern formed on the copper foil laminate.

The first circuit pattern may be electrically connected to an electrode of an external electronic component mounted on the substrate.

The second circuit pattern may be electrically connected to an electrode of the internal electronic component.

The first and second circuit patterns may be made of the same material.

The embedded PCB may further include a heat dissipation pattern formed on the surface of the internal electronic component and cooling the internal electronic component.

According to another exemplary embodiment of the present invention, there is provided a method for manufacturing an embedded printed circuit board (PCB), including: forming a cavity in a copper foil laminate; inserting an internal electronic component into the cavity; forming a first circuit pattern on the internal electronic component; laminating the copper foil laminate; forming a via hole in the copper foil laminate; and forming a second circuit pattern on the copper foil laminate.

The first circuit pattern may be connected to an electrode of an external electronic component mounted on a substrate through the via hole.

The second circuit pattern may be connected to an electrode of the internal electronic component through the via hole.

The first and second circuit patterns may be made of the same material.

The method may further include: forming a heat dissipation pattern on a surface of the internal electronic component.

DESCRIPTION OF THE PREFERRED EMBODIMENTS

Hereinafter, exemplary embodiments of the present invention will be described with reference to the accompanying drawings. However, the exemplary embodiments are described by way of examples only and the present invention is not limited thereto.

In describing the present invention, when a detailed description of well-known technology relating to the present invention may unnecessarily make unclear the spirit of the present invention, a detailed description thereof will be omitted. Further, the following terminologies are defined in consideration of the functions in the present invention and may be construed in different ways by the intention of users and operators. Therefore, the definitions thereof should be construed based on the contents throughout the specification.

As a result, the spirit of the present invention is determined by the claims and the following exemplary embodiments may be provided to efficiently describe the spirit of the present invention to those skilled in the art.

Figure 1:
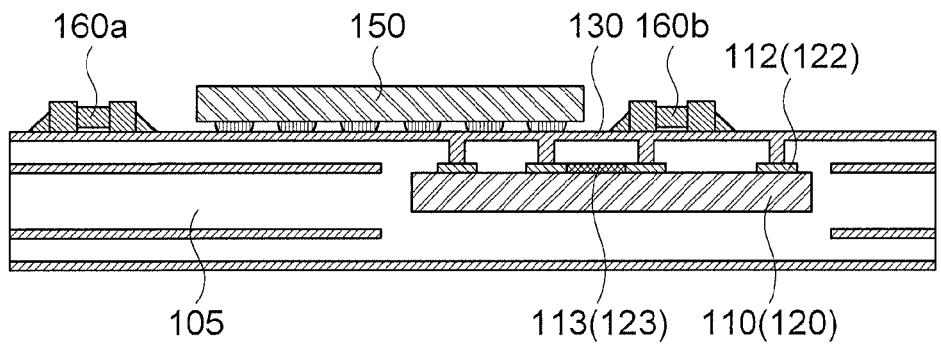
FIG. 1 is a cross-sectional view of an embedded printed circuit board (PCB) according to an exemplary embodiment of the present invention.
Figure 2:
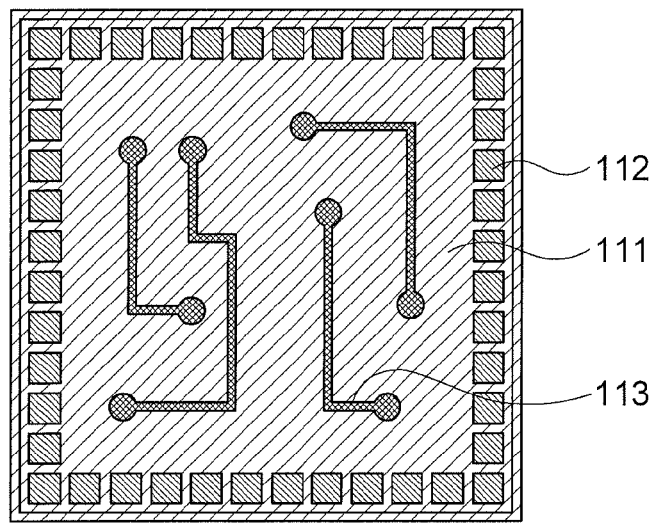
FIG. 2 is a view showing a wire bonding type internal electronic component inserted into the PCB.
Figure 3:
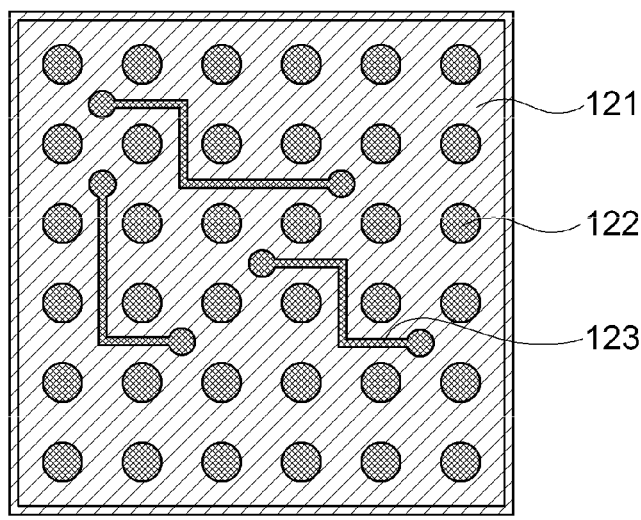
FIG. 3 is a view showing a CSP type internal electronic component inserted into the PCB.

FIG. 1 is a cross-sectional view of an embedded printed circuit board (PCB) according to an exemplary embodiment of the present invention, FIG. 2 is a view showing a wire bonding type internal electronic component inserted into the PCB, and FIG. 3 is a view showing a CSP type internal electronic component inserted into the PCB.

With reference to FIGS. 1 to 3, an embedded PCB according to an exemplary embodiment of the present invention may include: a copper foil laminate 105, internal electronic components 110 and 120, first circuit patterns 113 and 123 and a second circuit pattern 130.

The copper foil laminate 105 has a form in which a copper foil is attached to a polymer as typical raw material. Polymer is an insulating material and a circuit pattern is formed on the foil.

The copper foil laminate 105, a core substrate of an embedded PCB according to an exemplary embodiment of the present invention, may be an insulating substrate in which a stiffener such as glass fiber, carbon fiber, or the like, is immersed in an insulating resin. In this case, warping of the substrate can be reduced, enhancing reliability of the product. However, the present invention is not necessarily limited thereto; namely, a metal core made of a metallic material may be used as the core substrate and the material of the core substrate may be variably changed.

Internal electronic components 110 and 120 are inserted into the copper foil laminate 105, and in this case, a wire bonding type electronic component 110 or a chip scale package (CSP) type electronic component 120 may be used as the inserted internal electronic components.

As for the wire bonding type electronic component 110, an electrode of a chip and a terminal of a package are connected by using a wire, and as shown in FIG. 2, electrodes 112 are distributed on the edges of a surface 111 of the electronic component. The CSP type electronic component 120 refers to an electronic component whose mounting area is less than 120% of a chip area, and as shown in FIG. 3, electrodes 122 are distributed on a surface 121 of the electronic component overall.

The first circuit patterns 113 and 123 are formed on the surfaces 111 and 121 of the internal electronic components 110 and 120. The first circuit patterns 113 and 123 are patterns not connected to the electrodes 112 and 122 formed on the internal electronic components 110 and 120, and formed in a remaining surface space where the electrodes 112 and 122 are not formed. The first circuit patterns 113 and 123 are electrically connected to electrodes of an external electronic component 150 mounted on the substrate.

The second circuit pattern 130 is formed on the copper foil laminate 105, and in general, like a general embedded PCB, the second circuit pattern 130 is electrically connected to the electrodes 112 and 122 of the internal electronic components 110 and 120.

Namely, in order to utilize the surfaces of the internal electronic components 110 and 120 inserted into the substrate, as wiring spaces, circuit patterns are additionally formed on the surface spaces of the internal electronic components 110 and 120, thus optimizing the wiring structure and simplifying a layer configuration.

In detail, as shown in FIG. 1, the external electronic component 150 mounted on an outer side of the substrate is connected to the first patterns 113 and 123 formed on the internal electronic components 110 and 120 through a via hole, and connected to another external electronic component 160b via the via hole.

Namely, the external electronic component 150 is electrically connected to the external electronic component 160b through the first circuit patterns 113 and 123 formed on the internal electronic components 110 and 120 insertedly positioned within the substrate, rather than through the second circuit pattern 130 formed on the substrate.

In general, when an electronic component is insertedly positioned within a substrate, substrate wiring is not possible in the area where the electronic component is embedded.

The reason is because a space for connecting an electrode of the embedded electronic component is required and via processing, or the like, for a wiring connection is not available in the portion where the electronic component is embedded.

Thus, there is a problem in which wiring by the space in which an electronic component is embedded must be disposed at a different region or wiring must be disposed by adding a layer.

However, in an exemplary embodiment of the present invention, since the first circuit patterns 113 and 123 are formed to allow the external electronic components 150 and 160b to be connected to the internal electronic components 110 and 120 therethrough, a layer is not required to be added to connect the external components, and thus, wiring design can be optimized and an increase in the thickness of the substrate can be prevented.

Figure 4:
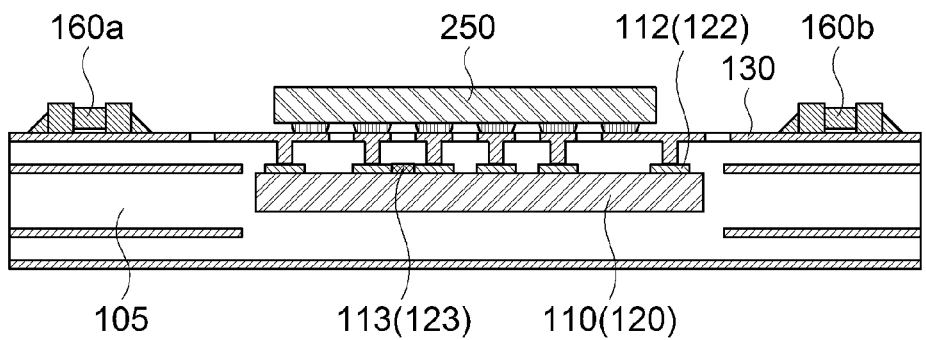
FIG. 4 is a cross-sectional view of an embedded printed circuit board (PCB) according to another exemplary embodiment of the present invention.

FIG. 4 is a cross-sectional view of an embedded printed circuit board (PCB) according to another exemplary embodiment of the present invention. With reference to FIG. 4, in an embedded PCB according to another embodiment of the present invention, a terminal of an external electronic component 250 is connected to the substrate by using the first circuit patterns 113 and 123 formed on the internal electronic components 110 and 120.

In general, in order to mount external electronic component in an area in which internal electronic components are embedded, a layer must be added to connect the terminals of the external electronic components and the substrate.

However, in the exemplary embodiment of the present invention, the surfaces of the internal electronic components 110 and 120 are utilized as wiring spaces, and accordingly, a layer is not required to be added to connect the terminals of the electronic components and the substrate.

In other words, since circuit patterns are formed on the surfaces of the internal electronic components 110 and 120, the surfaces of the internal electronic components 110 and 120 serve as additional layers.

Meanwhile, the first circuit patterns 113 and 123 and the second circuit pattern 130 may be made of the same material. By forming the circuit patterns with the same material, the circuit patterns can be easily formed and productivity of the PCB can be enhanced.

In addition, the embedded PCBs 100 and 200 may further include a heat dissipation pattern formed on the surfaces of the internal electronic components 110 and 120 and cooling the internal electronic components 110 and 120. Since heat exchange of the internal electronic components 110 and 120 embedded in the substrate with the exterior is not easy, measures should be taken to cool the internal electronic components 110 and 120.

The heat dissipation pattern is formed on the surfaces of the internal electronic components 110 and 120 and made of a material having high heat conductivity. The heat dissipation pattern, effectively dissipating heat generated from the internal electronic components 110 and 120 and the first circuit patterns 113 and 123, serves to prevent the internal electronic components 110 and 120 from malfunctioning, the PCB from being warped, or the like, due to high temperature.

In the exemplary embodiment of the present invention, as the internal electronic components 110 and 120 embedded in the substrate, the wire bonding type electronic component 110 or the CSP type electronic component 120 are taken as examples, but the present invention is not limited thereto and various other electronic components may be embedded in the substrate.

Hereinafter, a method for manufacturing an embedded PCB according to an exemplary embodiment of the present invention will now be described.

First, the method for manufacturing an embedded PCB includes forming a cavity in the copper foil laminate 105. This is to form spaces in which the internal electronic components 110 and 120 can be inserted. Here, the cavity may be formed through processing using a mechanical drill, a laser drill, or the like.

As described above, the copper foil laminated layer 105, a core substrate of an embedded PCB according to an exemplary embodiment of the present invention, may be an insulating substrate in which a stiffener such as glass fiber, carbon fiber, or the like, is immersed in an insulating resin, but the present invention is not necessarily limited thereto. That is, a metal core made of a metallic material may be used as the core substrate and the material thereof may be variably changed.

After the internal electronic components 110 and 120 are inserted into the cavity formed in the copper foil laminate 105, the first circuit patterns 113 and 123 are formed on the surfaces of the internal electronic components 110 and 120.

Here, it is described that the first circuit patterns 113 and 123 are formed after the internal electronic components 110 and 120 are inserted into the substrate, but the first circuit patterns 113 and 123 may be formed before the internal electronic components 110 and 120 are inserted into the substrate, and then, the internal electronic components 110 and 120 with the first circuit patterns 113 and 123 formed thereon, respectively, may be inserted into the substrate.

Next, the copper foil laminate 105 is laminated. In this case, the lamination refers to a configuration of a multilayered PCB formed by building up PCBs one by one through a build-up process, rather than a configuration of uni-layered PCB. Through the build-up process, the substrates can be manufactured one layer at a time and quality thereof can be evaluated, thereby enhancing production yield of the overall multilayered PCB, and wirings of the multiple layers can be precisely connected, thus manufacturing a high density compact PCB.

And then, a via hole is formed in the laminated copper foil laminate, and the second circuit pattern 130 is formed. The second circuit pattern 130 may be formed through a known technique such as tenting, semi-additive process, a modified semi-additive process, or the like.

The second circuit pattern 130 may be connected to the electrodes of the internal electronic components 110 and 120 through the via hole. The via hole may be a through hole penetrating both sides of the PCB or an inner via hole connecting a printed circuit layer. Preferably, the through hole is a plated through hole (PHT), and preferably, the inner via hole is a laser via hole (LVH), but the present invention is not limited thereto.

The first circuit patterns 113 and 123 formed on the internal electronic components 110 and 120 are connected to an electrode of the outer electronic component 150 mounted on the substrate through the via hole. Namely, the outer electronic component 150 mounted on the substrate uses the circuit patterns formed within the substrate.

In the case of a general embedded PCB, a wiring space is lost by the space occupied by the electronic component embedded in the substrate. However, in the embedded PCB according to the exemplary embodiment of the present invention, since the surface spaces of the internal electronic components 110 and 120 embedded in the substrate are utilized as wiring spaces, thus additionally securing wiring spaces to optimize a wiring design and advantageously removing the necessity of an additional layer for connecting the electrode of the outer electronic component 150 mounted on the outer side of the substrate.

Here, the first circuit patterns 113 and 123 and the second circuit pattern 130 may be made of the same material. By forming the circuit patterns with the same material, the circuit patterns can be easily formed and productivity of the PCB can be enhanced.

Meanwhile, the method for manufacturing an embedded PCB according to the exemplary embodiment of the present invention may further include forming a heat dissipation pattern on the surfaces of the internal electronic components.

The heat dissipation pattern can dissipate heat generated from the internal electronic components 110 and 120 and the first circuit patterns 113 and 123, obtaining a cooling effect.

Thus, malfunction of the electronic components and a warning phenomenon of the PCB due to high temperature can be prevented.

In addition, the forming of the heat dissipation pattern and the forming of the first circuit patterns 113 and 123 on the internal electronic components 110 and 120 may be simultaneously performed.

According to the exemplary embodiments of the present invention, in the embedded PCB and a manufacturing method thereof, since the surface spaces of the electronic components embedded in the substrate are utilized as wiring spaces, a wiring design can be optimized, layers can be simplified, and an increase in the thickness of the substrate can be prevented.

Also, malfunction of the embedded electronic components or a warping phenomenon of PCB due to generated heat can be prevented.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

Accordingly, the scope of the present invention is not construed as being limited to the described embodiments but is defined by the appended claims as well as equivalents thereto.

What is claimed is:

1. An embedded printed circuit board (PCB) comprising:
    a copper foil laminate;
    an internal electronic component inserted into the copper foil laminate;
    a first circuit pattern formed on a surface of the internal electronic component; and
    a second circuit pattern formed on the copper foil laminate.

2. The embedded PCB according to claim 1, wherein the first circuit pattern is electrically connected to an electrode of an external electronic component mounted on the substrate.

3. The embedded PCB according to claim 1, wherein the second circuit pattern is electrically connected to an electrode of the internal electronic component.

4. The embedded PCB according to claim 1, wherein the first and second circuit patterns are made of the same material.

5. The embedded PCB according to claim 1, further comprising:
    a heat dissipation pattern formed on the surface of the internal electronic component and cooling the internal electronic component.

6. A method for manufacturing an embedded printed circuit board (PCB), the method comprising:
    forming a cavity in a copper foil laminate;
    inserting an internal electronic component into the cavity;
    forming a first circuit pattern on the internal electronic component;
    laminating the copper foil laminate;
    forming a via hole in the copper foil laminate; and
    forming a second circuit pattern on the copper foil laminate.

7. The method according to claim 6, wherein the first circuit pattern is connected to an electrode of an external electronic component mounted on a substrate through the via hole.

8. The method according to claim 6, wherein the second circuit pattern is connected to an electrode of the internal electronic component through the via hole.

9. The method according to claim 6, wherein the first and second circuit patterns are made of the same material.

10. The method according to claim 6, further comprising:
    forming a heat dissipation pattern on a surface of the internal electronic component.

\* \* \* \* \*